(12) United States Patent
Wada

(10) Patent No.: US 9,500,228 B2
(45) Date of Patent: Nov. 22, 2016

(54) SLIDING MEMBER AND SLIDING BEARING

(71) Applicant: Taiho Kogyo Co., Ltd., Aichi (JP)

(72) Inventor: Hitoshi Wada, Aichi (JP)

(73) Assignee: Taiho Kogyo Co., Ltd., Aichi (JP)

( * ) Notice: Subject to any disclaimer, the term of this patent is extended or adjusted under 35 U.S.C. 154(b) by 0 days.

(21) Appl. No.: 14/773,415

(22) PCT Filed: Mar. 25, 2014

(86) PCT No.: PCT/JP2014/058265
§ 371 (c)(1),
(2) Date: Sep. 8, 2015

(87) PCT Pub. No.: WO2014/157192
PCT Pub. Date: Oct. 2, 2014

(65) Prior Publication Data
US 2016/0025131 A1    Jan. 28, 2016

(30) Foreign Application Priority Data
Mar. 29, 2013  (JP) ................. 2013-072010

(51) Int. Cl.

| | |
|---|---|
| *B22F 7/02* | (2006.01) |
| *F16C 33/12* | (2006.01) |
| *C30B 7/12* | (2006.01) |
| *C30B 29/02* | (2006.01) |
| *C22C 9/02* | (2006.01) |
| *C22C 12/00* | (2006.01) |
| *F16C 17/02* | (2006.01) |
| *F16C 33/14* | (2006.01) |
| *B32B 15/01* | (2006.01) |

(Continued)

(52) U.S. Cl.
CPC ............. *F16C 33/122* (2013.01); *B32B 15/01* (2013.01); *C22C 9/02* (2013.01); *C22C 12/00* (2013.01); *C30B 7/12* (2013.01); *C30B 19/103* (2013.01); *C30B 29/02* (2013.01); *C30B 30/02* (2013.01); *F16C 17/02* (2013.01); *F16C 33/12* (2013.01); *F16C 33/14* (2013.01)

(58) Field of Classification Search
None
See application file for complete search history.

(56) References Cited

U.S. PATENT DOCUMENTS

| | | | | |
|---|---|---|---|---|
| 5,342,698 A | * | 8/1994 | Fujisawa | ................. F16C 33/12 384/912 |
| 6,231,744 B1 | * | 5/2001 | Ying | ........................ B82B 1/00 205/206 |

(Continued)

FOREIGN PATENT DOCUMENTS

| | | |
|---|---|---|
| EP | 2095940 A1 | 9/2009 |
| EP | 2275590 A1 | 1/2011 |

(Continued)

OTHER PUBLICATIONS

International Search Report issued in PCT/JP2014/058265 mailed on Jun. 24, 2014 (2 pages).
Written Opinion of the International Searching Authority issued in PCT/JP2014/058265 mailed on Jun. 24, 2014 (6 pages).
Office Action in corresponding Chinese Patent Application No. 201480013859.4 dated Apr. 21, 2016, with translation (12 pages).
Extended European Search Report issued in corresponding European Application No. 14773594.8 dated Aug. 11, 2016 (7 pages).

*Primary Examiner* — Humera Sheikh
*Assistant Examiner* — Seth Dumbris
(74) *Attorney, Agent, or Firm* — Osha Liang LLP

(57) ABSTRACT

The present invention discloses a sliding member, comprised of a base layer including soft particles made of a soft material softer than a matrix and deposited in the matrix, and a soft layer made of the soft material formed on a surface of the base layer, wherein: the soft layer includes an epitaxial growth portion that is epitaxially grown from the soft particles.

2 Claims, 4 Drawing Sheets

(51) Int. Cl.
*C30B 19/10* (2006.01)
*C30B 30/02* (2006.01)

(56) References Cited

U.S. PATENT DOCUMENTS

| | | | |
|---|---|---|---|
| 6,652,675 B2 * | 11/2003 | Sakai | C22C 1/0425 148/432 |
| 7,651,784 B2 * | 1/2010 | Rumpf | C25D 3/54 205/261 |
| 2011/0224112 A1 * | 9/2011 | Mukai | C22C 1/0425 508/103 |
| 2012/0277131 A1 | 11/2012 | Asakura et al. | |
| 2016/0025132 A1 * | 1/2016 | Wada | B32B 15/01 428/558 |

FOREIGN PATENT DOCUMENTS

| | | |
|---|---|---|
| GB | 2348210 A | 9/2000 |
| JP | 2005-163074 A | 6/2005 |
| JP | 2006-057777 A | 3/2006 |
| JP | 2009-203504 A | 9/2009 |
| JP | 2011-163382 A | 8/2011 |
| WO | 2009/139440 A1 | 11/2009 |
| WO | 2010/030031 A1 | 3/2010 |

* cited by examiner

SLIDING MEMBER AND SLIDING BEARING

TECHNICAL FIELD

The present invention relates to a sliding member and a sliding bearing whereon a mating member is sliding.

BACKGROUND ART

A technology that an intermediate layer made of a material, e.g. Ni on Cu alloy is formed and an overlay made of Bi is formed on the intermediate layer, is known (Patent documents JP2011-163382A). Accordingly, the overlay made of soft Bi can improve conformability.

CITATION LIST

Patent Literature

[PTL1]
JP2011-163382A

SUMMARY OF THE INVENTION

Technical Problem

However, there is a problem that adhesiveness between the intermediate layer and the overlay is poor. That is, there is a problem that the overlay is peeled from the intermediate layer because, cleavage fractures progress between the intermediate layer and the overlay.

The present invention is made in consideration of such a problem, and provides a technology to improve adhesiveness of a soft layer.

Solution to Problem

The present invention discloses a sliding member, comprised of a base layer including soft particles made of a soft material softer than a matrix and deposited in the matrix, and a soft layer made of the soft material formed on a surface of the base layer. The soft layer includes an epitaxial growth portion that is epitaxially grown from the soft particles.

The adhesiveness between the intermediate layer and the overlay can be improved, because the soft layer made of the soft material, same to the material of the soft particles deposited in the matrix, adhere to the soft particles. The soft particles adhered to the soft layer can be anchors to improve the adhesiveness of the soft layer with the base layer, because the soft particles are originally deposited in the base layer. Especially, the epitaxial growth portion of the soft layer can strongly adhere to the soft particles of the base layer, because the epitaxial growth portion is formed of the soft material epitaxially grown from the soft particles. The strongly adhered portion comprised of the epitaxial growth portion and the soft particles of the base layer, is formed penetrating an interface between the base layer and the soft layer. Therefore, the strongly adhered portion can refrain progress of the cleavage fractures at the interface between the base layer and the soft layer and can improve the adhesiveness between the base layer and the soft layer.

The base layer can be any layers as long as including the matrix and the soft particles, and the base layer can be supported by the back metal. The soft material can be any materials that are softer than the matrix and are able to deposit in the matrix when the base layer is formed. For example, the soft material can be included in the lining in an amount which is more than solid solubility limit for the matrix. The soft layer includes a portion adhering to the matrix of the base layer and a portion adhering to the soft particles exposed on the surface of the base layer. In the portion adhering to the soft particles exposed on the surface of the base layer, the epitaxial portion epitaxially grown from the soft particles is formed.

The matrix of the base layer can be Cu alloy and the soft material can be Bi. The conformability can be realized by forming the soft layer made of Bi, because Bi is softer than Cu alloy. In addition, Cu alloy means the alloy including Cu as a main component. The soft particles of Bi can deposit in Cu alloy because Bi does almost not have solid solubility for Cu. However, the matrix of the base layer does not limit to Cu alloy and the material of the matrix can be selected according to circumstances e.g. the hardness of the mating member or the load affecting to the mating member. Further, materials e.g. Pb, Sn, In as long as softer than the matrix and are able to deposit in the matrix, can be the soft material.

DESCRIPTION OF EMBODIMENT

Figure 1:
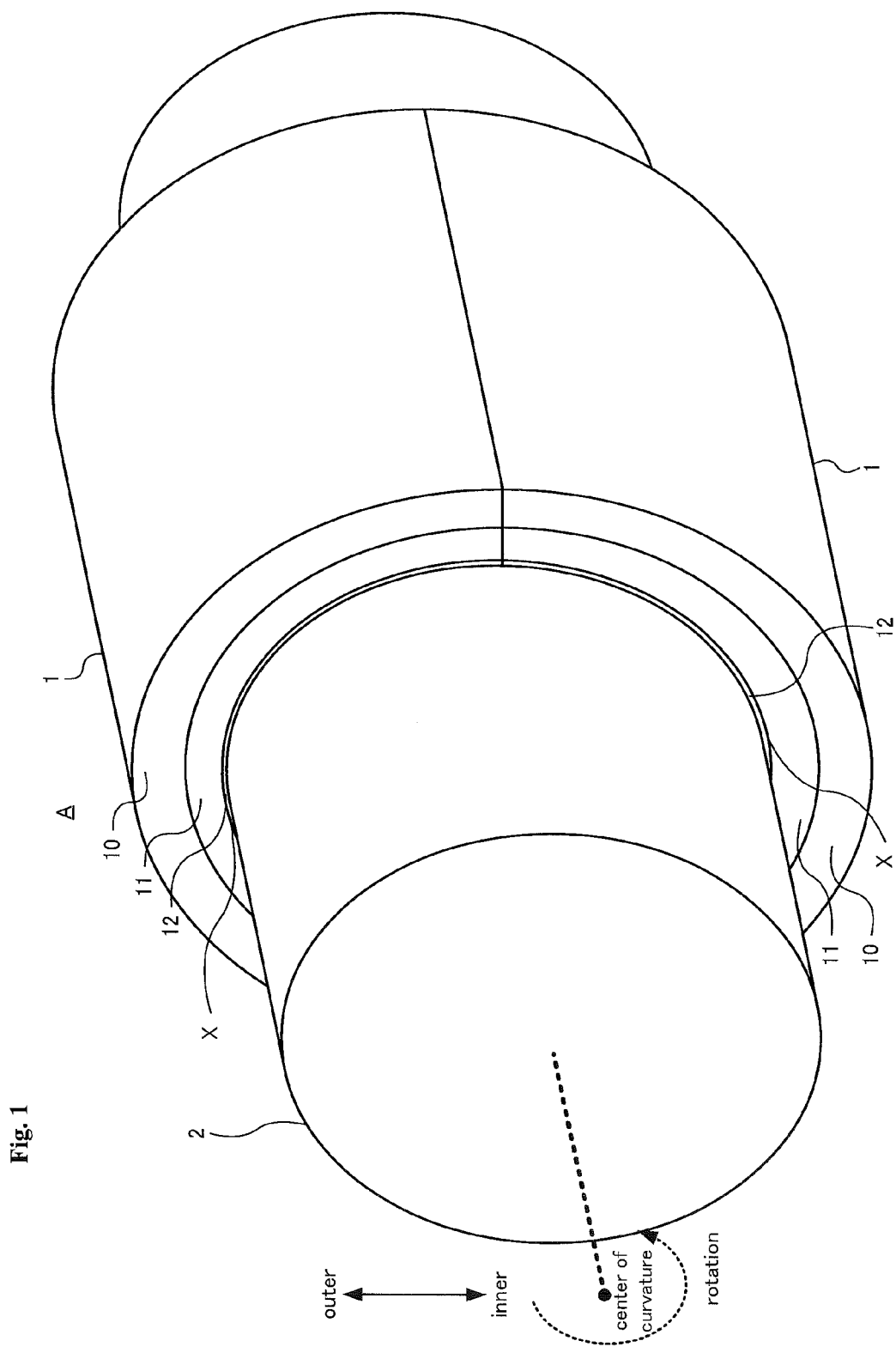
FIG. 1 is a perspective view of a sliding member.

Preferred embodiments of the present invention will be described in the following order.
(1) First Embodiment
  (1-1) Configuration of a Sliding Member:
  (1-2) Measuring Method:
  (1-3) Manufacturing Method of a Sliding Member:
(2) Other Embodiment
  (1) First Embodiment
  (1-1) Configuration of a Sliding Member:

FIG. 1 is a perspective view of a sliding member 1 as an embodiment of the present invention. The sliding member 1 is comprised of a back metal 10, a lining 11 and an overlay 12. The sliding member 1 is a metal member in a half pipe shape that is a bisection shape of a hollow cylinder sectioned at a diametral plane. A cross-sectional shape of the sliding member 1 is a half circular arc. A sliding bearing A can be manufactured by combining two sliding members 1 to be in a cylindrical shape. A mating shaft 2 (e.g. a crankshaft of an engine) is inserted in an inner hollow space of the sliding bearing A. An outer diameter of the mating shaft 2 is a little smaller than an inner diameter of the sliding bearing A. A lubricating oil (e.g. engine oil) is provided to a clearance formed between an outer surface of the mating shaft 2 and an inner surface of the sliding bearing A. Then the outer surface of the mating shaft 2 can slide on the inner surface of the sliding bearing A.

The sliding member 1 has a layered structure that the back metal 10, the lining 11 and the overlay 12 are laminated in order from a far side of the center of curvature. Therefore, the back metal 10 is an outermost layer of the sliding member 1 and the overlay 12 is an innermost layer of the sliding member 1. Each of the back metal 10, the lining 11 and the overlay 12 has a constant thickness in a circumferential direction. The thickness of the back metal 10 is 1.3 mm. The thickness of the lining 11 is 0.2 mm. And the thickness of the overlay 12 is 10 μm. A radius of a surface of the overlay 12 facing the center of curvature (an inner radius of the sliding member 1) is 40 mm. In this specification, "the inner side" means a side nearby the center of curvature of the sliding member 1 and "the outer side" means an opposite side to the center of curvature of the sliding member 1. The inner surface of the overlay 12 corresponds to a sliding surface between the sliding member 1 and the mating shaft 2.

The back metal 10 is made of steel consisted of 0.15 wt % (weight percentage for the back metal 10) of C (copper), 0.06 wt % of Mn (manganese) and the balance Fe (ferrum). In addition, the back metal 10 can be made of a material that can support a load transmitted from the mating shaft 2 through the lining 11 and the overlay 12. Therefore the back metal 10 can be made of a material other than the steel.

The lining 11 is a layer laminated on an inner surface of the back metal 10. The lining 11 corresponds to a base layer of the present invention. The lining 11 is consisted of 10 wt % (weight percentage for the lining 11) of Sn (tin), 8 wt % of Bi (bismuth) and the balance. The balance is consisted of Cu and unavoidable impurities. The unavoidable impurities included in the lining 11 are elements e.g. Mg (magnesium), Ti (titanium), B (boron), Pb (lead) and Cr (chromium). The unavoidable impurities are contaminated when the materials of the lining 11 are refined and/or scraped. Total weight percentage of the unavoidable impurities is less than 1.0 wt %.

Figure 2A:
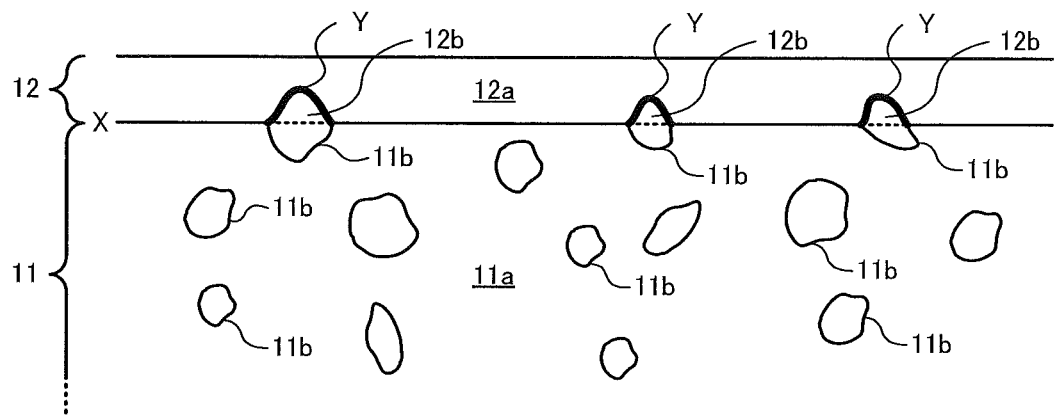
FIG. 2A) and (2B) are cross sectional views of sliding member.

FIG. 2A) is a schematic cross sectional views of the sliding member 1. In FIG. 2A), the curve of the sliding member 1 is ignored. In the lining 11, Bi particles 11b are deposited in a matrix 11a made of Cu—Sn alloy. Bi particles 11b are softer than the matrix 11a and correspond to the soft particles of the present invention. Strength and wear resistance can be improved by adopting hard Cu—Sn alloy as the matrix 11a of the lining 11.

The average equivalent circle diameter of Bi particles 11b on the cross sectional plane of the lining 11 was 100 μm. That is, the average area of Bi particles 11b on the cross sectional plane of the lining 11 was 2500 πμm². The area ratio of Bi particles 11b on the cross sectional plane of the lining 11 was 10%. The average equivalent circle diameter, the average area and the area ratio of Bi particles 11b on a boundary surface X between the lining 11 and the overlay 12 can be considered as same as the average equivalent circle diameter, the average area and the area ratio of Bi particles 11b on arbitrary cross sectional planes, because the distribution of Bi particles 11b in the lining 11 has uniformity and no directional dependency.

The overlay 12 is a layer laminated on an inner surface of the lining 11. The overlay 12 corresponds to the soft layer of the present invention. The inner surface of the lining 11 corresponds to the boundary surface X between the lining 11 and the overlay 12. The overlay is consisted of Bi and unavoidable impurities. The unavoidable impurities included in the overlay 12 are elements e.g. Sn, Fe and Pb. The unavoidable impurities are impurities contaminated from plating liquid for the overlay 12. In the lining 11, total weight percentage of the unavoidable impurities is not more than 1.0 wt % and the weight percentage of Bi is not less than 99%.

The overlay 12 includes epitaxial growth portions 12b and original growth portions 12a. The epitaxial growth portions 12b are portions made of Bi crystal epitaxially grown from Bi particles 11b exposed on the inner surface of the lining 11, as growth starting points. Therefore, the crystal grain structure of the epitaxial growth portions 12b is identical to the crystal grain structure of Bi particles 11b included in the lining 11. The crystal grain structure of Bi particles 11b included in the lining 11 is determined according to the crystal growth condition of Bi particles 11b in the lining 11.

The epitaxial growth portions 12b strongly adhere to Bi particles 11b included in the lining 11, because the epitaxial growth portions 12b are portions made of Bi crystal epitaxially grown from Bi particles 11b exposed on the inner surface of the lining 11. The united portions formed by strong adhesion between the epitaxial growth portions 12b and Bi particles 11b included in the lining 11, is shaped to penetrate the boundary surface X between the lining 11 and the overlay 12.

Figure 2B:
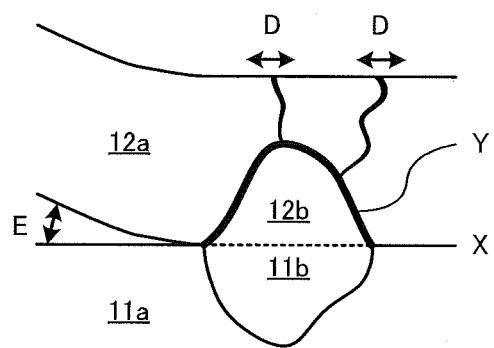

FIG. 2B) is a schematic diagram showing a state wherein the overlay 12 is peeled from the lining 11. As shown in the FIG. 2B), even if a cleavage fracture E peeling the overlay 12 from the lining 11 is arisen, the united portions formed by adhesion between the epitaxial growth portions 12b and Bi particles 11b included in the lining 11 can refrain the cleavage fracture E from progressing. Therefore, adhesiveness between the lining 11 and the overlay 12 can be improved.

Figure 3A:
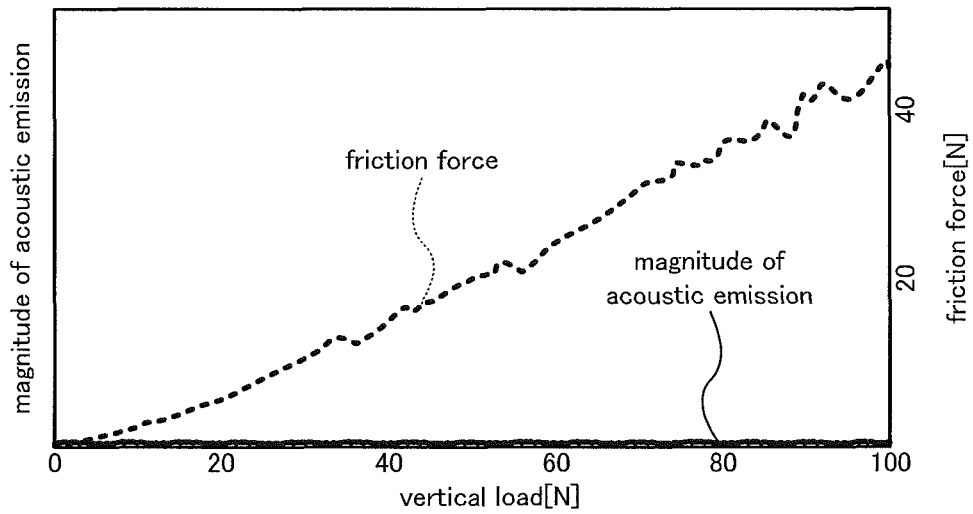
FIG. 3A) and (3B) are graphs of acoustic emission.
Figure 3B:
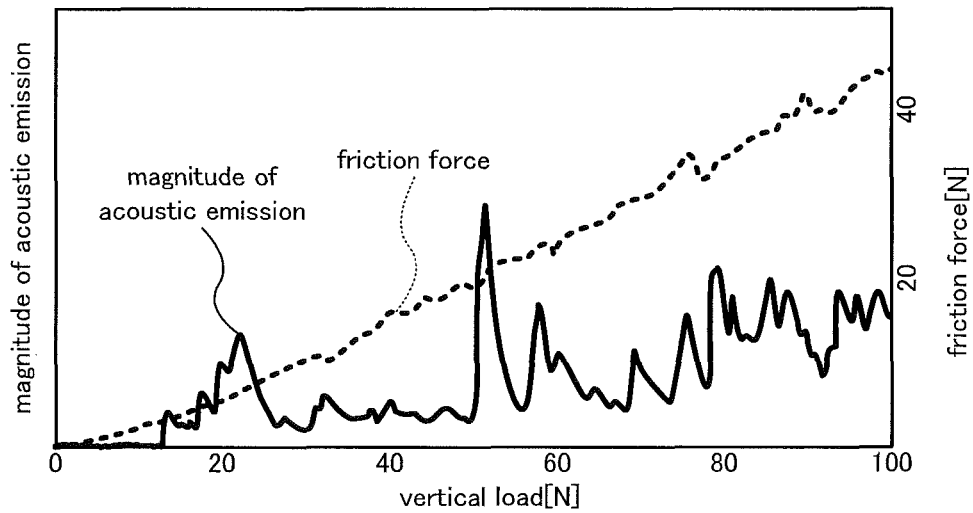

FIG. 3A) and FIG. 3B) are graphs showing magnitude of acoustic emission in case a friction force is worked on the sliding surface of the sliding member 1. In the FIG. (3A) and FIG. 3B), a horizontal axis shows a vertical load worked on the overlay 12, and a first vertical axis (right side axis) shows the friction force. As shown in the FIG. 3A) and FIG. 3B), the friction force (broken line) is mostly proportional to the vertical load. A second vertical axis (left side axis) in the FIG. 3A) and FIG. 3B) shows the magnitude of the acoustic emission. The larger value of the second vertical axis is, the larger the magnitude of the acoustic emission is. The magnitude of the acoustic emission corresponds to a sound pressure of a sound generated when the friction force was worked on the overlay 12.

The FIG. 3A) shows the acoustic emission in case the friction force was worked on the sliding surface of the sliding member 1 (embodiment of the present invention) whose average epitaxial index was 70%. The FIG. 3B) shows the acoustic emission in case the friction force was worked on the sliding surface of the sliding member 1 (comparison example) whose maximum epitaxial index was 10%. The acoustic emission is a sound wave generated by inner fracture of the sliding member 1 caused by the friction force worked on the sliding surface. The inner fracture of the sliding member 1 that is main cause of the acoustic emission, is generally considered to the cleavage fracture at the boundary surface X between the lining 11 and the overlay 12. The reason is that the lining 11 and the overlay 12 are easy to peel because Bi composing the overlay 12 is not solid-solved in Cu and does not form a compound with Cu. The epitaxial index is an index that becomes larger if area occupying ratio of the epitaxial growth portions 12b on the boundary surface X between the lining 11 and the overlay 12. Details of the epitaxial index will be explained hereinafter.

Comparing the FIG. 3A) and FIG. 3B), the acoustic emission almost did not occur in the sliding member 1 whose average epitaxial index was 70% shown in the FIG. (3A), meanwhile the acoustic emission occurred in the sliding member 1 whose average epitaxial index is less than 50% shown in the FIG. 3B). Therefore, in case the epitaxial index becomes large, the cleavage fracture at the boundary surface X between the lining 11 and the overlay 12 can be refrained, and adhesiveness between the lining 11 and the overlay 12 can be improved.

The original growth portions 12*a* are the portions made of Bi crystal epitaxially grown from crystal nucleus formed on the surface of the matrix 11*a*. Therefore, Bi crystal grain structure in the original growth portions 12*a* is determined according to the crystal growth condition of forming the overlay 12 on the surface of the lining 11. Consequently, Bi crystal grain structure of the original growth portions 12*a* and the crystal grain structure of the epitaxial growth portions 12*b* are determined according to different crystal growth conditions each other. Therefore it can be said that the overlay is composed of the original growth portions 12*a* and the epitaxial growth portions 12*b* whose Bi crystal grain structure are different each other.

A boundary portion Y (shown by a bold line in the FIG. 2A)) whose Bi crystal grain structures is discontinuous, is formed between the original growth portions 12*a* and the epitaxial growth portions 12*b*, because the original growth portions 12*a* and the epitaxial growth portions 12*b* have different Bi crystal grain structures each other. In the present embodiment, the boundary portion Y between the original growth portions 12*a* and the epitaxial growth portions 12*b* has a convex shape protruding to the inner side of the sliding member 1

In the boundary portion Y between the original growth portions 12*a* and the epitaxial growth portions 12*b*, Bi crystal grain boundary is also discontinuous. Therefore, as shown in the FIG. 2B), even if a fatigue fracture D cleaving the crystal grain boundary in the original growth portions 12*a* occurs, it can be refrained the fatigue fracture D from penetrating the boundary portion Y between the original growth portions 12*a* and the epitaxial growth portions 12*b*. In the present embodiment, it can be refrained transmission of the fatigue fracture D from advancing into Bi particles 11*b* included in the lining 11, because the boundary portion Y between the original growth portions 12*a* and the epitaxial growth portions 12*b* exists in the overlay (closer to the overlay 12 than the boundary surface X between the lining 11 and the overlay 12). Consequently, deterioration of mechanical characteristics of the lining 11 can be refrained.

(1-2) Measuring Method:

The measurement values mentioned in the embodiment were measured by methods explained hereinafter.

The masses of atoms included in the layers of the sliding member 1 were measured by an ICP (Inductively Coupled Plasma) atomic emission spectrometry analyzer (ICPS-8100 made by SHIMADZU CORPORATION).

The average equivalent circle diameter of Bi particles 11*b* included in the lining 11 was measured by the methods as follows. First, the arbitrary cross sectional planes of the lining 11 (not limited in directions vertical to the rotation axis of the mating shaft 2) were polished by alumina abrasive grains whose diameter were 2 μum. Observation image (backscattered electron images) was prepared by imaging an observation view field covering an area of 0.02 mm$^2$ on the arbitrary cross sectional plane of the lining 11 by an electron microscope (JSM-6010A made by JEOL Ltd.) with 500 times of the optical magnification. Next, the observation image was input to an image analyzing system (LUZEX II made by NIRECO CORPORATION) and images of Bi particles 11*b* were detected from the observation image. There were edges (boundary where brightness, chroma or hue was changed more than a predetermined threshold) along outlines of the images of Bi particles 11*b*. So, areas closed by the edges are detected from the observation image, as the images of Bi particles 11*b*, by the image analyzing system.

Next, the images of Bi particles 11*b* were extracted from the observation image and the projected area-equivalent diameters (measurement parameter: HEYWOOD) of the images of all Bi particles 11*b* was measured by the image analyzing system. The projected area-equivalent diameter was a diameter of a circle having an area identical to the area of the image of Bi particles 11*b* and a real-space length converted from the diameter of image of Bi particles 11*b* based on the optical magnification. Further, an arithmetic mean (sum total/number of Bi particles 11*b*) of projected area-equivalent diameters of all Bi particles 11*b* was measured as the average equivalent circle diameter of Bi particles 11*b*. Further, the total area of Bi particles 11*b* was measured by multiplying the area of a circle with a diameter identical to the average equivalent circle diameter of Bi particles 11*b* and the number of Bi particles 11*b* existing in the observation view field. Finally, the area ratio of Bi particles 11*b* was measured by dividing the total area of Bi particles 11*b* by an area of the observation view field. In addition, the projected area-equivalent diameters less than 1.0 μm were ignored for calculation of the average equivalent circle diameter of Bi particles 11*b* .e.g., because the projected area-equivalent diameters less than 1.0 μm might decrease a reliability of the projected area-equivalent diameter and a reliability of detection of the components.

Figure 4A:
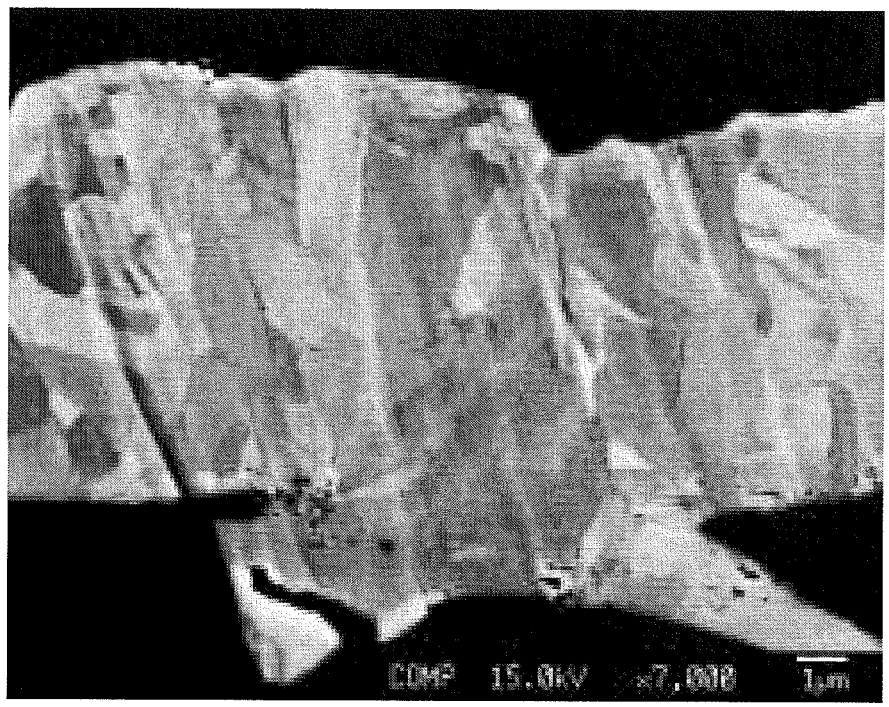
FIG. 4A) and (4B) are photographs showing cross sectional view of sliding member.
Figure 4B:
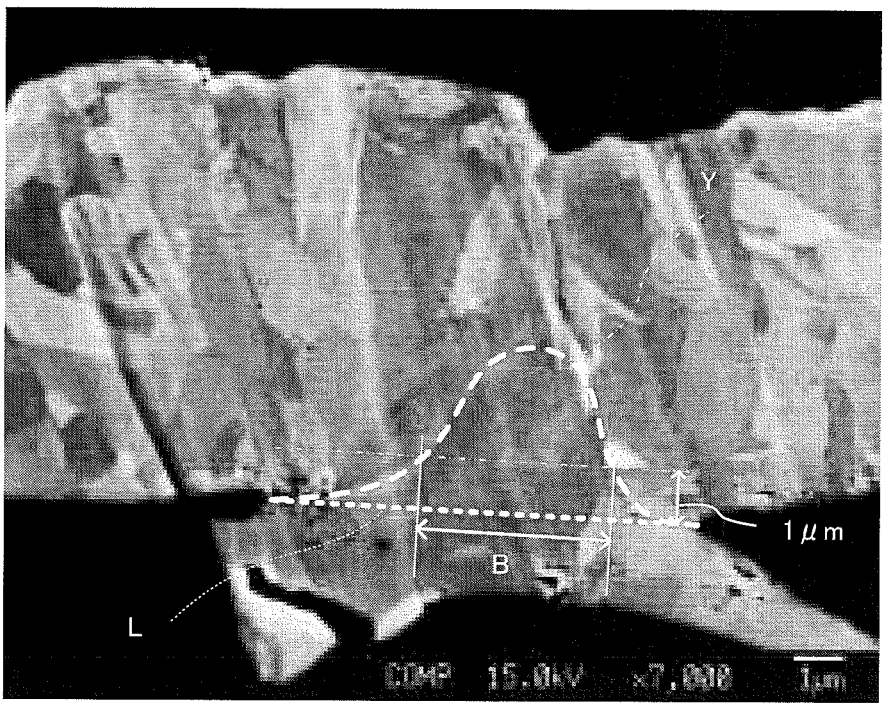

The epitaxial index was measured by the methods as follows. First, a diametral cross sectional plan of the sliding member 1 was polished by a cross section polisher. Observation image was prepared by imaging an arbitrary observation view field covering an area of 0.02 mm$^2$ (rectangular area with 0.1 mm vertical length and 0.2 mm horizontal width) on the cross sectional plane of the lining 11 by an electron microscope with 7000 times of the optical magnification. FIG. 4A) and FIG. 4B) are photographs of the observation images. As shown in the FIG. 4A), a portion of the observation image where Bi particles 11*b* existed at the boundary surface X between the lining 11 and the overlay 12 is visually observed. Further, as shown in the FIG. (4B), a line segment L (broken line) connecting both endpoints of the Bi particle 11*b* at the boundary surface X was detected and a length of the line segment L was measured.

Next, portions of the line segment L that edges existed in an area not farther than 1 μm and portions B (arrow) of the line segment L that edge did not exist in the area not farther than 1 μm were detected. The epitaxial index was measured by dividing the length of the portions B by the length of the line segment L. The epitaxial index of each of Bi particles 11*b* existing at the boundary surface X was measured.

In addition, the minimum epitaxial index of the sliding member 1 (embodiment of the present invention) shown in the The FIG. 3A) was 50%, the average epitaxial index of the same was 70% and the maximum epitaxial index of the same was 95%. On the other hand, the maximum epitaxial index of the sliding member 1 (comparison example) shown in the FIG. 3B) was 10%. In addition, the continuous edge connecting both endpoints of the line segment L corresponds the boundary portion Y (one dot chain line) between the original growth portions 12*a* and the epitaxial growth portions 12*b*. The edge can be found between the original growth portions 12*a* and the epitaxial growth portions 12*b* because the size and the array direction of the Bi crystal grains are different between the original growth portions 12*a* and the epitaxial growth portions 12*b*. In addition, the edge can be detected by the image analyzing system input the observation image.

(1-3) Manufacturing Method of a Sliding Member:

In the beginning, a low carbon steel flat plate whose thickness was same as the thickness of the back metal 10 was prepared.

Next, the powder of the materials for the lining 11 was scattered on the flat plate made of the low carbon steel. Concretely, Cu powder, Bi powder and Sn powder were scattered on the low carbon steel flat plate to be same weight ratio as the weight ratio of the components of abovementioned lining 11. As long as the weight ratio of the components of the lining 11 can be satisfied, powder of alloy e.g. Cu—Bi and Cu—Sn can be scattered on the low carbon steel flat plate. The particle diameter of the powder was regulated to be not larger than 150 μm by a test sieve (JIS Z8801).

Next, the low carbon steel flat plate and the powder scattered on the low carbon steel flat plate were sintered. The sinter was performed in inert atmosphere and the sintering temperature was set to the range of 700 to 1000° C. Cooling was performed after sinter.

The Cu alloy layer was formed on the low carbon steel flat plate after completion of the cooling. The soft Bi particles 11b deposited were included in this Cu alloy layer.

Next, the low carbon steel flat plate whereon the Cu alloy layer was formed, was processed by the press working to be in the bisection shape of the hollow cylinder sectioned at a diametral plane. Then, the press working was performed to make the outer diameter of the low carbon steel flat plate same as the outer diameter of the sliding member 1.

Next, the Cu alloy layer formed on the low carbon steel flat plate was processed by grinding. Then, the grinding depth was controlled to make the thickness of the Cu alloy layer formed on the low carbon steel flat plate same as the thickness of the lining 11. The grinding was performed by the lathe on which it set the cutting tool made of the abrasive e.g. sintered diamonds. The surface of the lining 11 after grinding was the boundary surface X between the lining 11 and the overlay 12.

Next, the overlay 12 was formed by laminating Bi as the soft material with thickness of 10 μm on the surface of the lining 11, by the electroplating. The procedure of the electroplating was as follows. First, the degreasing of the surface of the lining 11 was performed by flowing direct current to the surface of the lining 11 in an electrolyte. Next, the surface of the lining 11 was rinsed with water. Further, unnecessary oxides on the surface of the lining 11 except for oxide films formed by an anodic oxidation were removed by pickling. After that, the surface of the lining 11 was rinsed with water again. After completion of abovementioned pretreatments, the electroplating was performed by supplying current to the surface of the lining 11 immersed in the plating liquid. The composition of the plating liquid included Bi with density range of 10 to 50 g/L, the organic sulfonic acid with density range of 25 to 100 g/L and additive agents with density range of 0.5 to 50 g/L. The temperature of the plating liquid was 25° C. Further, the current supplied to the surface of the lining 11 was direct current and the current density of the direct current was in the range of 0.5 to 5.0 A/dm$^2$.

By performing the electroplating as remarked above, Bi crystal was epitaxially grown from Bi particles 1ib existing on the boundary surface X between the lining 11 and the overlay 12 and the epitaxial growth portions 12b were formed in the overlay 12. After completion of lamination of the overlay 12, the manufacturing of the sliding member 1 was completed by rinsing with water and drying. Further the sliding bearing A was manufactured by combining two sliding members 1 to be in the cylindrical shape.

(2) Other Embodiment

The sliding member 1 composing the sliding bearing A that supports the crankshaft for the engine was exemplary shown in the above embodiment, the sliding bearing A for other use can be made of the sliding member 1 of the present invention. For example, gear bushes for transmission, piston bushes and boss bushes can be made of the sliding member 1. Needless to say, the sliding member 1 can be parts whereon any mating members other than shafts are sliding. The matrix of the lining 11 does not limit to Cu alloy, the material of the matrix can be selected according to the hardness of the mating shaft 2. Further, materials e.g. Pb, Sn, In (indium) that are softer than the matrix and are able to deposit in the matrix, can be the soft material.

DESCRIPTION OF THE REFERENCE NUMERALS

1:sliding member, 2:mating shaft, 10:back metal, 11:lining, 11a:matrix, 11b:Bi particles, 12:overlay, 12a:original growth portion, 12b:epitaxial growth portion, X:boundary surface, Y:boundary portion

The invention claimed is:

1. A sliding member comprising:
a base layer comprising soft particles made of a soft material deposited in a matrix; and
a soft layer made of the soft material,
wherein the soft material is softer than the matrix,
wherein the soft layer is formed on a surface of base layer, and
wherein the soft layer comprises an epitaxial growth portion that is comprises epitaxially grown from the soft particles, wherein the matrix is made of Cu alloy; and the soft material is Bi.

2. A sliding bearing comprising:
a base layer comprising soft particles made of a soft material deposited in a matrix; and
a soft layer made of the soft material,
wherein the soft material is softer than the matrix,
wherein the soft layer is formed on a surface of the base layer, and
wherein the soft layer comprises an epitaxial growth portion that comprises epitaxially grown soft particles, wherein the matrix is made of Cu alloy; and the soft material is Bi.

* * * * *